United States Patent
Lee et al.

(10) Patent No.: US 7,277,597 B2
(45) Date of Patent: Oct. 2, 2007

(54) PARTIAL K-SPACE RECONSTRUCTION FOR RADIAL K-SPACE TRAJECTORIES IN MAGNETIC RESONANCE IMAGING

(75) Inventors: Jin Hyung Lee, Menlo Park, CA (US); John M. Pauly, Redwood City, CA (US); Dwight G. Nishimura, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 692 days.

(21) Appl. No.: 10/464,236

(22) Filed: Jun. 17, 2003

(65) Prior Publication Data

US 2004/0258326 A1 Dec. 23, 2004

(51) Int. Cl.
*G06K 9/36* (2006.01)
(52) U.S. Cl. ...................................... 382/280
(58) Field of Classification Search ............... 382/280, 382/131; 324/300, 307, 309, 310, 301
See application file for complete search history.

(56) References Cited

U.S. PATENT DOCUMENTS

| | | | | |
|---|---|---|---|---|
| 5,243,284 A | * | 9/1993 | Noll | 324/309 |
| 5,784,042 A | * | 7/1998 | Ono et al. | 345/94 |
| 6,018,600 A | * | 1/2000 | Levin et al. | 382/284 |
| 6,043,652 A | * | 3/2000 | Liu | 324/309 |
| 2003/0215154 A1 | * | 11/2003 | Pauly et al. | 382/254 |

FOREIGN PATENT DOCUMENTS

WO    WO99/53440    *   4/1999     382/276

OTHER PUBLICATIONS

Noll et al., "Homodyne Detection In Magnetic Resonance Imaging," IEEE Transactions on Medical Imaging, vol. 10, No. 2, Jun. 1991, pp. 154-163.
Tsai et al., "Reduced Aliasing Artifacts Using Variable-Density k-Space Sampling Trajectories," Magnetic Resonance in Medicine 43:452-458 (2000).
Haacke et al., "A Fast, Iterative, Partial-Fourier Technique Capable of Local Phase Recovery," Journal of Magnetic Resonance 92, 126-145 (1991).

* cited by examiner

*Primary Examiner*—Joseph Mancuso
*Assistant Examiner*—Nancy Bitar
(74) *Attorney, Agent, or Firm*—Beyer Weaver LLP

(57) ABSTRACT

A modified projection on convex sets (POCS) algorithm and method for partial k-space reconstruction using low resolution phase maps for scaling full sets of reconstructed k-space data. The algorithm can be used with partial k-space trajectories in which the trajectories share a common point such as the origin of k-space, including variable-density spiral trajectories, projection reconstruction trajectories with a semicircle region acquisition, and projection reconstruction trajectories with every other spike acquired.

7 Claims, 2 Drawing Sheets

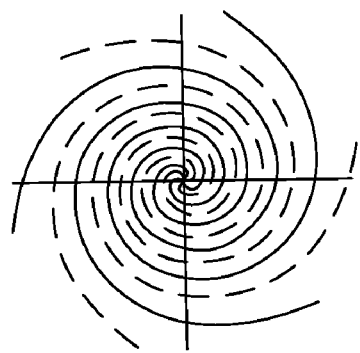 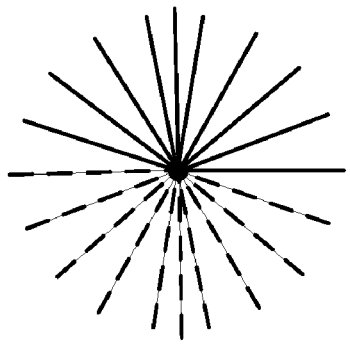 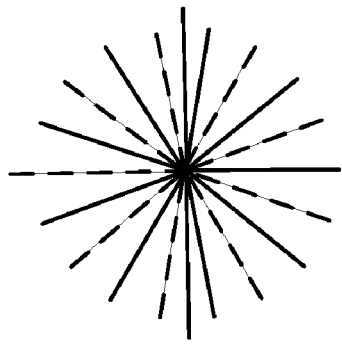
FIG. 1A  FIG. 1B  FIG. 1C
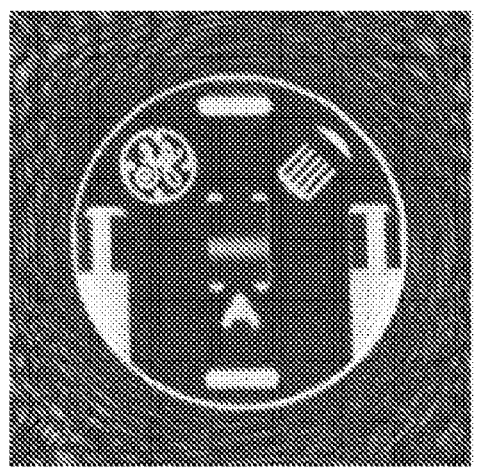 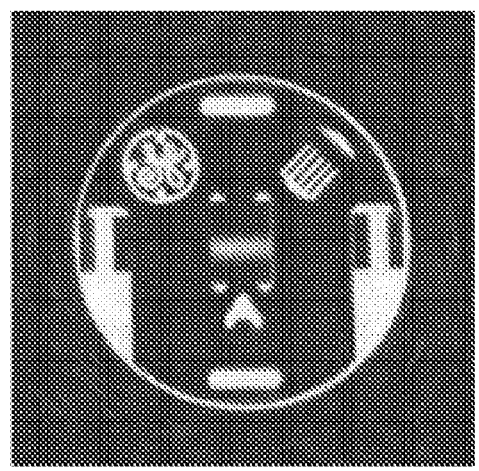
FIG. 3A  FIG. 3B

PARTIAL K-SPACE RECONSTRUCTION FOR RADIAL K-SPACE TRAJECTORIES IN MAGNETIC RESONANCE IMAGING

GOVERNMENT RIGHTS

The U.S. government has rights in the disclosed invention pursuant to NIH grant HL39297 to Stanford University.

BACKGROUND OF THE INVENTION

This invention relates generally to magnetic resonance imaging (MRI), and more particularly, the invention relates to fast MRI imaging using partial k-space data acquisition.

MRI signals for reconstructing an image of an object are obtained by placing the object in a magnetic field, applying magnetic gradients for slice selection, applying a magnetic excitation pulse to tilt nuclei spins in the desired slice, and then detecting MRI signals emitted from the tilted nuclei spins. The detected signals can be envisioned as traversing lines in a Fourier transformed space (k-space) with the lines aligned and spaced parallel in Cartesian trajectories and emanating from an origin in k-space in spiral trajectories.

Variable-density spiral trajectories have been extensively used in fast MRI imaging, but other radial trajectories are also used. Partial-k-space reconstruction algorithms exploit the facts that the Fourier transform of real images have Hermitian symmetry. Since most MR images depict the spin density as a function of the spatial position, the images should be real under ideal conditions. Therefore, ideally only half of the spatial frequency data would need to be collected. Unfortunately, due to various sources of phase errors, the images end up being complex. As a result, partial k-space reconstruction requires some form of phase correction. This leads to the partial k-space reconstruction method that involves the steps of phase correction and conjugate synthesis. However, performing one step after the other can provide major error. Iterative algorithms are used to overcome this problem by iterating through the phase correction and conjugate synthesis so that the phase condition and the conjugate symmetry condition are better assured. Even with iterative reconstruction methods, partial k-space reconstruction does not work well for many k-space trajectories. It is especially difficult to perform partial k-space reconstruction, even with the iterative algorithm when the data is acquired in an even and odd fashion. If the data acquisition is not done in a continuous fashion to cover half of k-space, reconstruction is difficult since the errors become a coherent aliasing error.

For spiral trajectories, under-sampling can be done by acquiring every other interleave while using variable-density spirals to obtain a low resolution phase map. An odd number of interleaves should be used to take advantage of the conjugate symmetry. The major issue with this under-sampling scheme is whether the alternate interleaves are conjugate symmetric with the missing alternate interleaves. Local variants in resonance frequency can result in shifts in the actual k-space location and with the alternate under-sampling scheme, the missing data has less chance of having the conjugate symmetry. Since both the prior art phase-corrected conjugate synthesis and homodyne assume an artifact in quadrature with the image, they do not work well when artifacts are coherent. Projection on convex sets (POCS) as disclosed by Haacke et al., "A Fast, Iterative Partial-Fourier Technique Capable of Local Phase Recovery," Journal of Magnetic Resonance 92, 126-145 (1991) provides a method of improved local phase recovery and improved magnitude images when only limited, uniformly-sampled Fourier data are presented.

The present invention provides a modified POCS algorithm for reconstructing partial k-space data.

SUMMARY OF THE INVENTION

The present invention is an iterative process for applying conjugate synthesis and phase correction in partial k-space reconstruction for radial k-space trajectories in magnetic resonance imaging.

For a particular set of trajectories, if a k-space trajectory is a radial trajectory going through a common point with all other trajectories, such as the origin in k-space, the reconstruction is improved by using a known scale at the end of each iterative step to avoid any significant error in the scale of synthesized data.

More particularly, a POCS algorithm is modified to reconstruct partial k-space radial data where the missing data is filled in by iteratively applying conjugate synthesis and phase correction. First, the initial partial k-space data is filled into a zero matrix. The phase constraint obtained from the low resolution image is imposed in the image domain. Then the data is transferred into k-space data so that the missing data in the initial acquisition can be filled in. Since the phase constraint is imposed in the image domain and the missing data needs to be filled in the spatial frequency domain, the data must be gridded and inverse gridded repeatedly. Therefore, the density compensation and de-apodization is done fairly accurately in the gridding step. The gridding and inverse gridding steps also introduce some scaling in the data. Therefore, by scaling the data after inverse gridding to have the same maximum as the acquired data, convergence to a optimum can be ensured. The algorithm is particularly advantageous because the variable-density imaging gives an initial image that has minimal aliasing artifacts.

The invention object and features thereof will be more readily apparent from the following detailed description and appended claims when taken with the drawings.

BRIEF DESCRIPTION OF THE DRAWINGS

FIGS. 1A-1C illustrate k-space trajectories for which the present invention can be employed in partial k-space data reconstruction.

FIGS. 3A, 3B are images of a phantom using a regular gridding reconstruction and using reconstruction in accordance with the invention.

DETAILED DESCRIPTION OF ILLUSTRATED EMBODIMENTS

Figure 2:
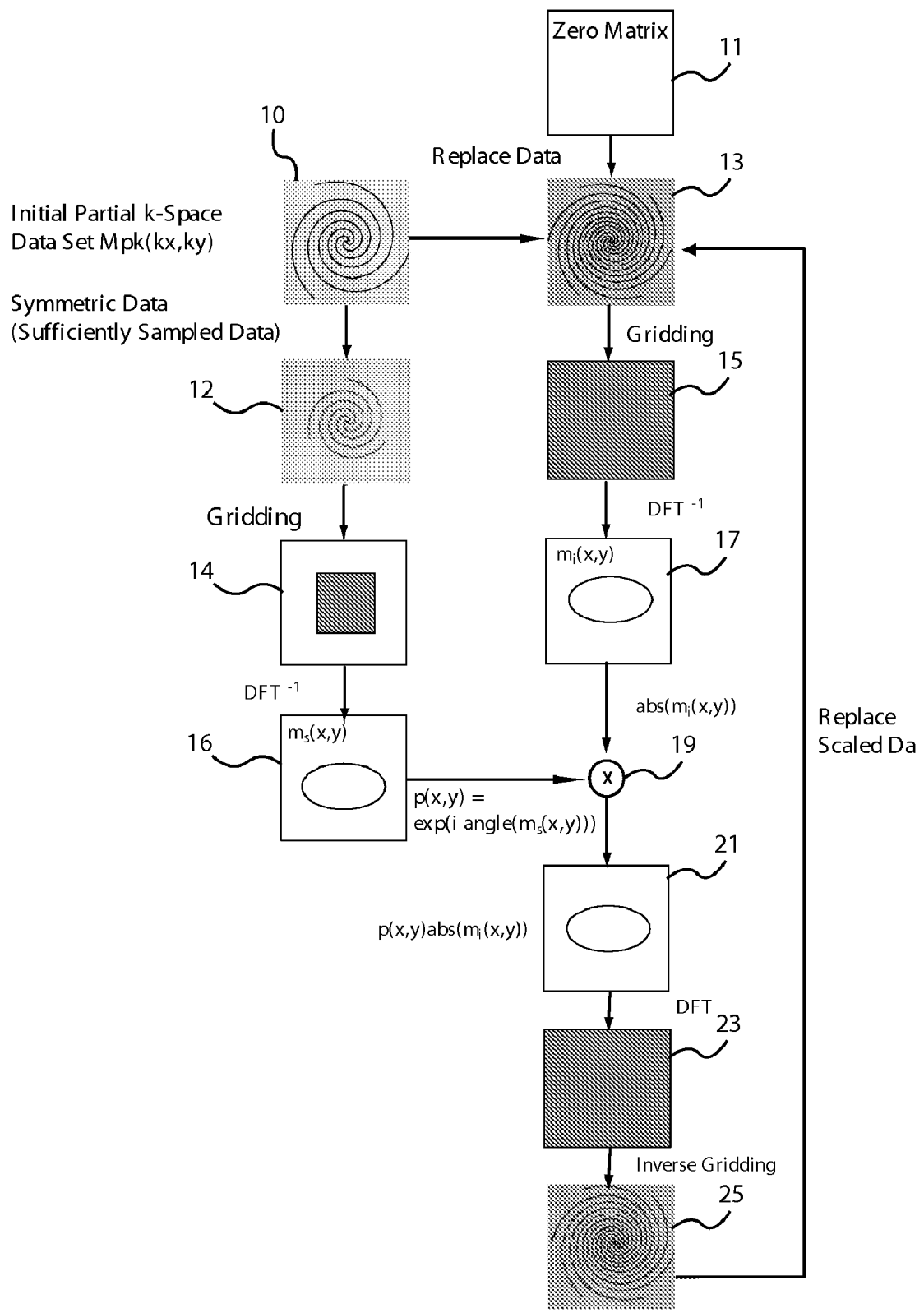
FIG. 2 is a flow diagram of a method of partial k-space reconstruction in accordance with an embodiment of the invention.

FIGS. 1A-1C illustrate k-space trajectories for which the present invention can be employed in partial k-space data reconstruction. In FIG. 1A, a variable-density spiral trajectory is shown in which the solid line spiral are sampled and the dashed line interleaved spirals are obtained by a reconstruction from the acquired spiral data. In FIG. 1B, projection reconstruction trajectories use a semicircle region acquisition (solid lines) with conjugate symmetry employed to reconstruct trajectories in the bottom semicircle region. FIG. 1C projection reconstruction trajectories with every other spoke acquired and with the interleaved spokes being reconstructed from the acquired trajectory data. This acquisition can be done in three different ways. This form of data can be obtained by acquiring every other half spoke with or without the extension beyond the k-space origin. The other way is to acquire every other bent full spokes.

In each of these trajectories, all trajectory lines pass through a common point at the origin. Since all readout lines contain common data at the common point, synthesized data can be scaled at each iteration so that the data at the origin is consistent. When the k-space trajectory involved is non-Cartesian, a gridding and inverse gridding step involved can produce significant error in the scale of the synthesized data. However, by using the known scale due to the redundant acquisition at the k-space origin (or some other common point in k-space), the synthesized data can be scaled at the end of each iteration step to avoid significant error in the scale of the synthesized data. The redundant data point does not need to be the k-space origin, however, in most cases, when all of the interleaves pass through a same point in k-space, it is most often designed to be the k-space origin. Additionally, having the signal at the origin be correct is particularly important since it contains considerable energy.

Consider now the flow diagram of FIG. 2 which illustrates the invention as applied to reconstruction of partial k-space spiral data as illustrated in FIG. 1A. The initial partial k-space dataset shown at 10 is used to replace data in a zero matrix 11 as shown at 13 using an interpolation of the initial partial k-space dataset. However, the interpolation includes phase errors due to various sources and the interpolated images end up being complex. As a result, the partial k-space reconstruction requires some form of phase correction.

Phase correction is accomplished by determining the phase of a limited portion of the initial partial k-space dataset as shown at 12. The symmetric data from 12 is then gridded at 14 and then passed through an inverse digital Fourier transform to provide a time domain image at 16 denoted $m_s(x,y)$. The phase at each point in the image at 16, $p(x,y)$ is given by $e^{i\angle m_s(x,y)}$. This phase is then used at each iteration step to correct phase of the data at 13. More particularly, the partial k-space dataset and the reconstructed data at 13 is passed through gridding at 15 and then inverse Fourier transformed to provide a time domain image at 17. The magnitude of the data at 17, $|m_i(x,y)|$, is then adjusted at 19 by the phase, $p(x,y)$ from 16 to provide a rescaled image at 21, $p(x,y)|m_i(x,y)|$. This image is then Fourier transformed at 23 back to k-space with inverse gridding to provide k-space data along the trajectories at 25. The data at 25 is then used to update the interpolated data at 13. Before data at 25 is used to update data at 13, data at 25 is scaled to have the same value at the origin of k-space as data at 13. Since all readout lines pass through the origin, the synthesized data is scaled at each iteration step so that the data at the origin is consistent, thereby helping the iteration converge to a correct data value.

Referring to FIG. 1, the solid lines show the data acquired in the acquisition step and the dotted lines show the data to be synthesized using the partial k-space reconstruction algorithm. FIG. 1A shows the variable-density spiral trajectory where every other interleave is acquired. FIGS. 1B, 1C show the projection reconstruction trajectories with different partial k-space acquisition. In FIG. 1B, a semicircle region of k-space is acquired with spokes extending to the low spatial frequency component of the other half of the semicircle. This is necessary to acquire the phase map for the phase correction step in the reconstruction. In FIG. 1C, either every other projection is acquired with a half spoke or a half spoke extended to the low spatial frequency component of the other side of the k-space origin. Since every other projection is acquired, there is no need to extend a spoke beyond the origin. If extended, a higher resolution phase map can be acquired. The same data set as the non-extended half spoke data can also be acquired using a bent full spoke acquisition.

Experiments were conducted using a GE 1.5T whole body scanner with maximum gradient amplitude of 40 mT/m and maximum slew-rate of 150 mT/m/ms. The spiral trajectory was combined with a gradient-recalled echo sequence with a flip angle of 90°.

A phantom experiment was conducted with a nominal field of view of 15×15 cm² and a resolution of 0.6×0.6 mm². Slice thickness was 5 mm. Repetition time was 18 ms and readout duration was 9.1 ms. Partial k-space acquisition was done using 13 interleaves. The full k-space acquisition required 22 interleaves for the given FOV, resolution, and readout time. The variable-density spirals were designed to have a density linearity decreasing with radial distance and k-space. FIG. 3A shows an image using regular gridding reconstruction in which some aliasing due to under-sampling is present. FIG. 3B illustrates an image using the method in accordance with the invention and shows significant improvement with minimal distortion of the desired signal.

Since variable-density sampling using spiral trajectories produces relatively mild aliasing artifacts, the invention can be used to further reduce the artifacts. This can lead to further decrease in scan time by allowing more under-sampling for variable-density spirals. The algorithm generally converges in less than 5 iterations. While this embodiment utilizes spiral trajectories, the invention is applicable to other k-space trajectories which share a common point, such as k-space origin, for example.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of partial k-space data reconstruction where partial k-space data is initially acquired and all k-space data trajectories share a common point in k-space, said method comprising the steps of:
   a) forming a set of k-space data including the initially acquired data and first interpolated k-space data to provide a full set of data, wherein the initial acquired data is low resolution,
   b) forming spatial domain image data using the full set of k-space data,
   c) using the initially acquired data to establish phase of data,
   d) combining the time domain image data and the phase data,
   e) converting the combined data to k-space data,
   f) scaling the combined k-space data to have the same value as the initially acquired data at the origin,
   g) replacing interpolated data in the full set of k-space data with the scaled k-space data, and
   h) repeating steps b) through g) iteratively using gridding and inverse gridding to converge the reconstruction of interpolated data.

2. The method as defined by claim 1 wherein step b) includes gridding the full set of k-space data to form gridded data and inverse Fourier transforming the gridded data to provide spatial domain image data.

3. The method as defined by claim 2 wherein step c) includes gridding initially acquired k-space data to provide gridded data and inverse Fourier transforming the gridded data to provide spatial domain image data including phase of the data for combining with the spatial domain image data using the full set of k-space data from step b).

4. The method as defined by claim 1 wherein step f) includes Fourier transforming the scaled data and inverse gridding the Fourier transformed scaled data.

5. The method as defined by claim 1 wherein the partial k-space data comprises variable-density spiral trajectories.

6. The method as defined by claim 1 wherein the partial k-space data comprises semicircle projection reconstruction trajectories.

7. The method as defined by claim 1 wherein the partial k-space data comprises projection reconstruction trajectories with every other spike acquired using half spokes, extended half spokes and bent full spokes.

* * * * *

UNITED STATES PATENT AND TRADEMARK OFFICE
CERTIFICATE OF CORRECTION

| | | |
|---|---|---|
| PATENT NO. | : 7,277,597 B2 | Page 1 of 1 |
| APPLICATION NO. | : 10/464236 | |
| DATED | : October 2, 2007 | |
| INVENTOR(S) | : Lee et al. | |

It is certified that error appears in the above-identified patent and that said Letters Patent is hereby corrected as shown below:

Column 1:

• Please replace lines 5-8 with:

--FEDERALLY SPONSORED RESEARCH OR DEVELOPMENT
This invention was made with Government support under contracts HL039297 and AR046904 awarded by the National institutes of Health. The Government has certain rights in this invention.--

Signed and Sealed this
Nineteenth Day of April, 2011

David J. Kappos
*Director of the United States Patent and Trademark Office*